(12) United States Patent
Walther et al.

(10) Patent No.: US 11,470,426 B2
(45) Date of Patent: Oct. 11, 2022

(54) MEMS DEVICES

(71) Applicant: Infineon Technologies AG, Neubiberg (DE)

(72) Inventors: Arnaud Walther, Unterhaching (DE); Stefan Barzen, Munich (DE); Wolfgang Klein, Zorneding (DE); Johann Strasser, Schierling (DE)

(73) Assignee: Infineon Technologies AG, Neubiberg (DE)

( * ) Notice: Subject to any disclaimer, the term of this patent is extended or adjusted under 35 U.S.C. 154(b) by 620 days.

(21) Appl. No.: 16/537,308

(22) Filed: Aug. 9, 2019

(65) Prior Publication Data
US 2021/0044905 A1 Feb. 11, 2021

(51) Int. Cl.
*H04R 19/00* (2006.01)
*H04R 19/04* (2006.01)
*B81B 3/00* (2006.01)

(52) U.S. Cl.
CPC ............. *H04R 19/04* (2013.01); *B81B 3/001* (2013.01); *B81B 3/0021* (2013.01); *B81B 3/0027* (2013.01); *B81B 2201/0257* (2013.01)

(58) Field of Classification Search
CPC .. H04R 19/04; H04R 31/00; H04R 2201/003; H04R 19/005; B81B 3/001; B81B 3/0021; B81B 3/0027; B81B 2201/0257; B81B 3/007; B81B 2203/0127; B81B 7/02; B81B 2201/02; B81B 2203/01; B81B 7/04; B81C 1/00158; B81C 3/00; H01L 27/08
See application file for complete search history.

(56) References Cited

U.S. PATENT DOCUMENTS

| | | |
|---|---|---|
| 7,436,054 B2 | 10/2008 | Zhe |
| 9,736,590 B2 | 8/2017 | Klein et al. |
| 9,794,661 B2 | 10/2017 | Watson et al. |
| 2014/0077317 A1 | 3/2014 | Hsieh et al. |
| 2016/0340173 A1 | 11/2016 | Klein et al. |
| 2018/0115836 A1* | 4/2018 | Hsieh ............... H04R 31/003 |
| 2018/0352337 A1 | 12/2018 | Klein |
| 2019/0098424 A1 | 3/2019 | Dehe et al. |

* cited by examiner

*Primary Examiner* — Matthew A Eason
(74) *Attorney, Agent, or Firm* — Slater Matsil, LLP

(57) ABSTRACT

A micro electrical mechanical systems (MEMS) device includes a flexible membrane disposed over a substrate, and a first backplate disposed over the flexible membrane. The first backplate includes a first plurality of bumps facing the flexible membrane. The MEMS device further includes a plurality of features disposed at the flexible membrane, where each of the plurality of features being associated with a corresponding one of the first plurality of bumps.

20 Claims, 8 Drawing Sheets

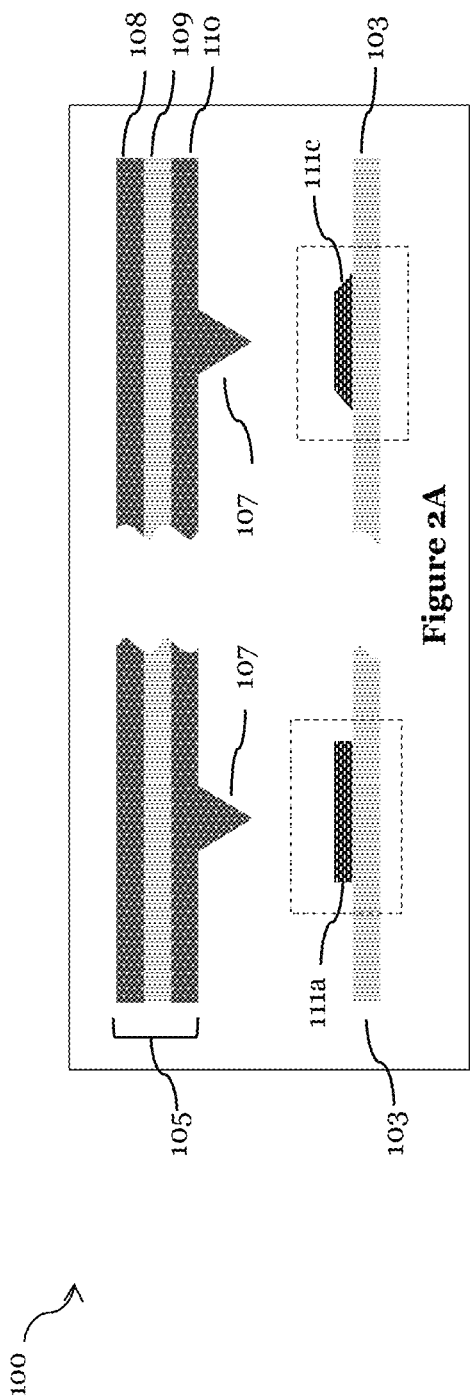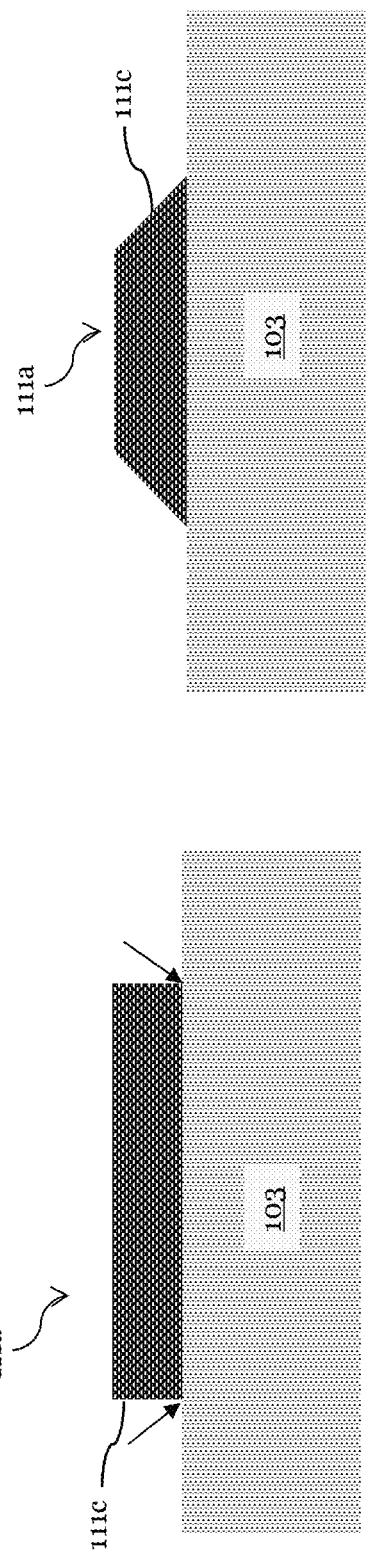

MEMS DEVICES

TECHNICAL FIELD

The present invention generally relates to an electronic device, and, in particular embodiments, to a structure for a microelectrical mechanical systems (MEMS) device.

BACKGROUND

Sensors are devices that contain transducing elements. Transducers are employed within electronic devices to convert signals from one domain to another. For example, some transducers can convert mechanical signals into electrical signals. Such is the case with acoustic microphones that contain transducing elements which convert sound waves into electrical signals. The information from the electronic signals is collected and then transferred to a signal processor that interprets the received signals and delivers output through readout mechanisms within the sensing device.

MEMS based sensors include a variety of transducers, such as accelerometers, oscillators, resonators, gyroscopes, and microphones. MEMS based sensors are produced using a range of microfabrication techniques similar to those used in the fabrication of integrated circuits.

Common electrostatic MEMS microphones utilize capacitive behavior to transduce physical stimuli, such as speech, into electrical signals. In such applications, the capacitive change in the sensor is converted to a voltage signal using interface circuits. These MEMS devices are comprised of a flexible membrane structure arranged in parallel to a rigid backplate structure. Together, they serve as the two electrode plates within the capacitive MEMS device. As sound waves penetrate through cavities within the device, they induce oscillations amongst the flexible membrane due to the pressure difference. This in turn causes variance in the distance of the air gap between the flexible membrane and the backplate. Resultantly, the variation in the air gap between the flexible membrane and the back plate is directly proportional to the change in capacitance of the MEMS device.

Often times, when this deflection occurs between the flexible membrane and the backplate, electrostatic forces buildup may cause the two surfaces to stick together when they come into contact with one another. To alleviate this occurrence, anti-sticking bumps are fabricated within the bottom surface of the backplate so they are positioned between the two electrode surfaces. These anti-sticking bumps serve the purpose of maintaining a certain working distance between the flexible membrane and the backplate so as to reduce the amount of contact area between the two electrodes surfaces.

SUMMARY

In accordance with an embodiment of the present invention, a micro electrical mechanical systems (MEMS) device includes a flexible membrane disposed over a substrate, and a first backplate disposed over the flexible membrane. The first backplate includes a first plurality of bumps facing the flexible membrane. The MEMS device further includes a plurality of features disposed at the flexible membrane, where each of the plurality of features being associated with a corresponding one of the first plurality of bumps.

In accordance with another embodiment of the present invention, a micro electrical mechanical systems (MEMS) device includes a deflectable layer disposed over a substrate, and a first backplate disposed over the deflectable layer. The first backplate includes a first plurality of anti-sticking structures facing the deflectable layer. The MEMS device further includes a plurality of reinforcement regions disposed at the deflectable layer, the plurality of reinforcement regions configured to reinforce the deflectable layer from stress induced failure, the plurality of reinforcement regions being associated with a corresponding one of the first plurality of anti-sticking structures.

In accordance with another embodiment of the present invention, a micro electrical mechanical systems (MEMS) device includes a first backplate including a first plurality of anti-sticking bumps and a flexible membrane including a first major surface and an opposite second major surface, a second plurality of anti-sticking bumps at the first major surface and a plurality of features at the second major surface. Each of the plurality of features is associated with a corresponding one of the second plurality of anti-sticking bumps. The MEMS device further includes a second backplate, where the flexible membrane is disposed between the first and the second backplates.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A illustrates a cross sectional view of an embodiment of a MEMS microphone in which additional material is deposited on top of a flexible membrane at the level of the bumps, and wherein

FIG. 2A, illustrates a cross sectional view of an embodiment of a MEMS microphone in which alternative embodiments for the side profile are depicted, and wherein FIGS. 2B and 2C represent a magnified portion of the dashed regions illustrated by FIG. 2A;

FIG. 6A illustrates a cross sectional view of an embodiment of a MEMS microphone in which sections of the flexible membrane is replaced by an alternate material, and wherein

DETAILED DESCRIPTION OF ILLUSTRATIVE EMBODIMENTS

The structure and using of various embodiments of a MEMS microphone are discussed in detail below. However, it should be valued that the various embodiments detailed herein may be applicable in a wide variety of disciplines. The specific embodiments described herein are merely illustrative of specific ways to make and use various embodiments, and should not be construed in a limited scope.

Conventional MEMS devices such as microphones are susceptible to be damaged by dust and particles during operation/assembly. For example, random particles traveling at high enough speeds can damage an electrode. These high speed particles can be generated in a multitude of fashions. For example, a mechanical shock can dislodge a loosely attached, otherwise dormant, particle within a duct between the outside of the device and the port. Similarly, particles suspended in air may be accelerated towards the microphone during the air-gun cleaning process during assembly of the device or after packaging.

The inventors of this application have determined that the flexible membrane is a significantly susceptible portion of the microphone because of stress induced by the particle. In particular, the inventors of this application determined that regions of the flexible membrane designed to be in contact with the anti-sticking bumps are more susceptible due to stress concentration in small regions. Embodiments of the present invention describe MEMS devices that are more immune to failure, e.g., due to particle damage, by the formation of additional features on the flexible membrane and optionally as well as on the plates of the MEMS devices.

A structural design of a MEMS device will first be described using FIGS. 1A-1B and 2A-2C. Alternative designs of the MEMS devices will then be described using FIGS. 3-7.

Figure 1A:
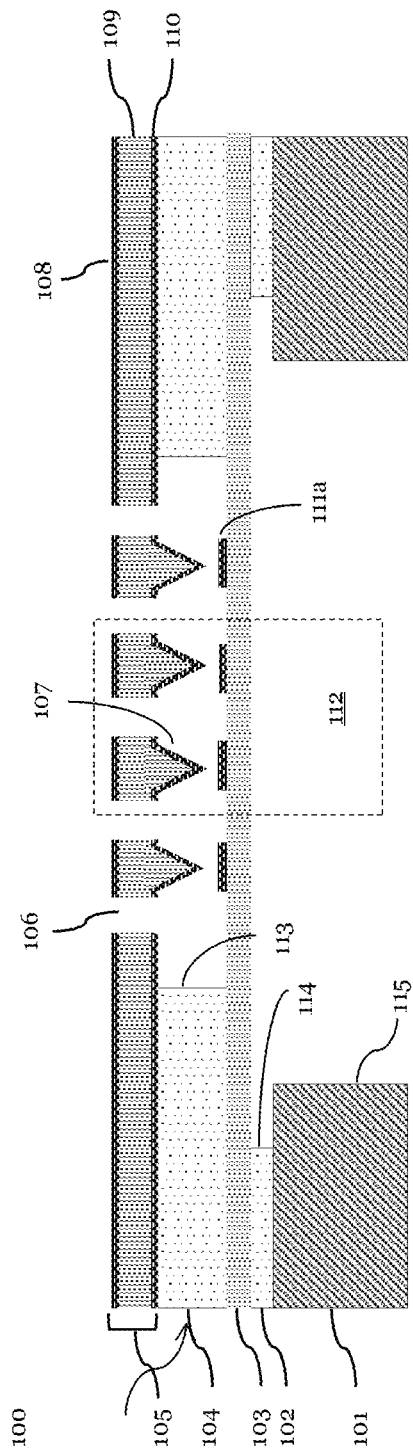
Figure 1B:
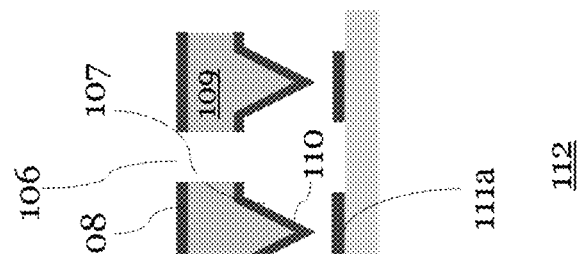
FIG. 1B represents a magnified portion of the dashed region illustrated by FIG. 1A.

FIG. 1A illustrates a cross sectional view of an embodiment of a MEMS microphone and wherein FIG. 1B represents a magnified portion of the dashed region illustrated by FIG. 1A.

Referring to FIG. 1A, in one or more embodiments, a micro electrical mechanical systems (MEMS) device 100 includes a substrate 101, a first clamping layer 102 and a second clamping layer 104, a flexible membrane 103, and a first backplate 105. In one embodiment, the MEMS device 100 is a microphone.

FIG. 1B represents a magnified portion of the MEMS device 100 indicated by the dashed region within FIG. 1A. In such embodiments, the flexible membrane 103 is a deflectable sensing membrane that forms a parallel plate capacitor with the first backplate 105. Sound pressure waves are incident on the flexible membrane 103 from the cavity 112, which is connected to a sound port (not shown) in the MEMS microphone. During operation, sound pressure waves incident from the cavity 112 may cause oscillations of the flexible membrane 103 towards and away from the first backplate 105, thereby changing the distance between the flexible membrane 103 and the first backplate 105, which in turn changes the capacitance between the flexible membrane 103 and the first backplate 105. For example, the change in capacitance may be sensed by readout electronics coupled to the flexible membrane 103 and the first backplate 105 through conductive lines (not shown).

The first backplate 105, which is disposed over the flexible membrane 103, is a rigid layer. In one embodiment, the first backplate 105 comprises a first insulating layer 108 and a second insulating layer no, a conductive layer 109, and a first plurality of bumps 107. The first plurality of bumps 107 serve as anti-sticking bumps to alleviate sticking due to electro-static forces that may arise when the flexible membrane 103 comes into contact with the first backplate 105. Anti-sticking bumps serve to maintain a certain distance between the first backplate 105 and the flexible membrane 103, and assist in reducing surface area contact. According to some embodiments, the first backplate 105 may include the perforations 106 of varying diameter sizes ranging from small to large. The perforations 106 may serve as release holes during an etch fabrication step in which portions of the second clamping layer 104 are removed. In one or more embodiments, the perforations 106 may include numerous small diameter holes arranged closely together and around the perimeter of a deflectable portion of the flexible membrane 103. The spacing and size of the perforations 106 may be used to control both the position and smoothness of the second clamping layer 104 and the second clamping layer edges 113, respectively.

According to various embodiments, the substrate 101 may be comprised of silicon material or any other material that can be utilized to form a supportive substrate structure for the various layers within the MEMS device 100.

A cavity 112 is formed within the substrate 101. In various embodiments, the cavity 112 may be formed using an etch fabrication technique, such as a Bosch process etch, that produces scalloped edges along the substrate sidewall 115. The flexible membrane 103 may include a fixed portion that is supported by the first clamping layer 102 and the second clamping layer 104, and an unfixed portion that is disposed over a cavity 112. According to various embodiments, the flexible membrane 103 may be comprised of any conductive material, such as doped polysilicon.

The first clamping layer 102 is disposed above the substrate 101. In some embodiments, the substrate sidewall 115 of the substrate 101 may extend past the first clamping layer edge 114. Alternatively, in other embodiments the first clamping layer edge 114 may extend past the substrate sidewall 115 and into the cavity 112. The first clamping layer 102 may be comprised of insulating material, such as tetraethyl orthosilicate (TEOS) oxide in some embodiments. Alternatively, the first clamping layer 102 may be formed of any other insulating material, such as another oxide or a dielectric.

The second clamping layer 104 is disposed above the flexible membrane 103, effectively lending itself as a support structure by "clamping" the fixed portion of the flexible membrane 103. In various embodiments of MEMS device 100, the first and the second clamping layers 102 and 104 may be rearranged such that the first clamping layer 102 extends beyond the substrate sidewall 115 and into the cavity 112, where the second clamping layer 104 does not extend beyond the substrate sidewall 115. In some embodiments, the second clamping layer 104 may be thicker than the first clamping layer 102, and vice versa. Similarly to the first clamping layer 102, the second clamping layer 104 may be comprised of insulating material, such as tetraethyl orthosilicate (TEOS) oxide or any another oxide or dielectric.

The first backplate 105 is formed on top of the second clamping layer 104 and, as stated, includes the first insulating layer 108, the conductive layer 109, and the second insulating layer no. In one embodiment, the first and the second insulating layers 108 and no are formed as silicon nitride layers. However, the conductive layer 109 is formed as a doped polysilicon layer. In general, the first backplate 105 can be fabricated from any combination of insulating or conductive materials known in the art. The air gap that exists between the first backplate 105 and the flexible membrane 103 may have a distance typically ranging from 500 nm to 5 μm. As stated earlier, the first backplate 105 also includes a first plurality of bumps 107 that serve as anti-sticking bumps to alleviate sticking due to electro-static forces that may arise when the flexible membrane 103 comes into contact with the first backplate 105. This first plurality of bumps 107 is comprised of layers from the second insulating layer no and the conductive layer 109 of the first backplate 105. Therefore, in one embodiment of MEMS device 100, the first plurality of bumps 107 may be comprised of a layer of silicon nitride and a layer of doped polysilicon. In other embodiments, the first plurality of bumps 107 may be fabricated from any other combination of insulating or conductive materials known to the art. The first plurality of bumps 107 may have a size of 100 nm to 2000 nm in height, and may have a variably sharp tip with a radius of curvature ranging from 10 nm to 1000 nm. Likewise, the first plurality of bumps 107 may have a flatter tip around the size of 50 nm to 500 nm.

As illustrated in FIGS. 1A and 1B, a first plurality of features 111a is disposed on the flexible membrane 103. The first plurality of features 111a comprise protrusions extending from the flexible membrane 103 in a direction towards the first plurality of bumps 107. Each of the first plurality of features 111a is associated with a corresponding one of the first plurality of bumps 107. The first plurality of features 111a comprise protrusions extending from the flexible membrane 103 in a direction towards the first plurality of bumps 107. According to some embodiments, the first plurality of features 111a may comprise a different material than the flexible membrane 103 (as shown in FIGS. 1A and 1B).

Each of the first plurality of features 111a comprises sidewalls orthogonal to a major outer surface of the flexible membrane 103. According to some embodiments, the first plurality of features 111a may be composed of a different material than that of the flexible membrane 103 (as shown in FIGS. 1A and 1B).

In various embodiments, the first plurality of features 111a comprises a material that is more immune to cracking than the flexible membrane 103, and in particular, has a higher fracture toughness than the flexible membrane 103. For example, the flexible membrane if made of polysilicon has a fracture toughness Kc of about 1 MPa·sqrt(m). However, in one or more embodiments, materials with similar or even lower fracture toughness (e.g., silicon oxide) may be used since the thickness increase provided by the first plurality of features 111a helps to dissipate the stress energy within the first plurality of features 111a and thereby avoiding it from reaching the flexible membrane 103. This is because cracks formed on the first plurality of features 111a do not have a functional impact on the operation of the MEMS device unlike cracks on the flexible membrane 103.

In various embodiments, the material of the first plurality of features 111a is more rigid than the flexible membrane 103 helping to minimize deformation of the underlying flexible membrane 103. Because of the higher rigidity of the first plurality of features ma, it is less susceptible to stress induced failure. Thus excessive stress applied by the first plurality of bumps, which otherwise may have caused cracking of the flexible membrane, is absorbed by the first plurality of features 111a minimizing damage to the flexible membrane 103.

Accordingly, the first plurality of features 111a may be composed of silicon nitride layers (SiN), silicon oxide layers (SiO2), silicon carbide layers (SiC), or any other combination of insulating material known to the aft.

In various embodiments, the first plurality of features ma may be constructed through conventional microfabrication schemes. For example, an insulating material, like those mentioned above, can be deposited on the top surface of the flexible membrane 103. Through various photolithographic and etching steps, coupled along with additional microfabrication processing schemes known to a person skilled in the art, such as cleaning and planarization, the first plurality of features 111a may be formed.

FIG. 2A, illustrates a cross sectional view of an embodiment of a MEMS device 100 in which alternative embodiments for the side profile of the first plurality of features 111a are depicted. FIGS. 2B and 2C represent a magnified portion of the dashed regions illustrated by FIG. 2A.

As detailed above, the edges of the first plurality of features 111a can be etched in a manner that achieves a vertical sidewall profile (as illustrated in FIG. 2B). In other embodiments of the MEMS device 100, the sidewalls 111c of the first plurality of features 111a can be etched in a manner that achieves more of an angled sidewall profile (as illustrated in FIG. 2C). The rationale behind it being, a more angled sidewall profile for the first plurality of features 111a reduces the concentration of stress endured at the interface (indicated by the arrows in FIG. 2B) where the edges of the first plurality of features 111a meets the top surface of the flexible membrane 103.

The first plurality of features 111a may range in size from 10 nm to 1 μm in thickness and may have a lateral dimension around 500 nm to 5 μm larger than that of the contact area of the first plurality of bumps 107.

Figure 3:
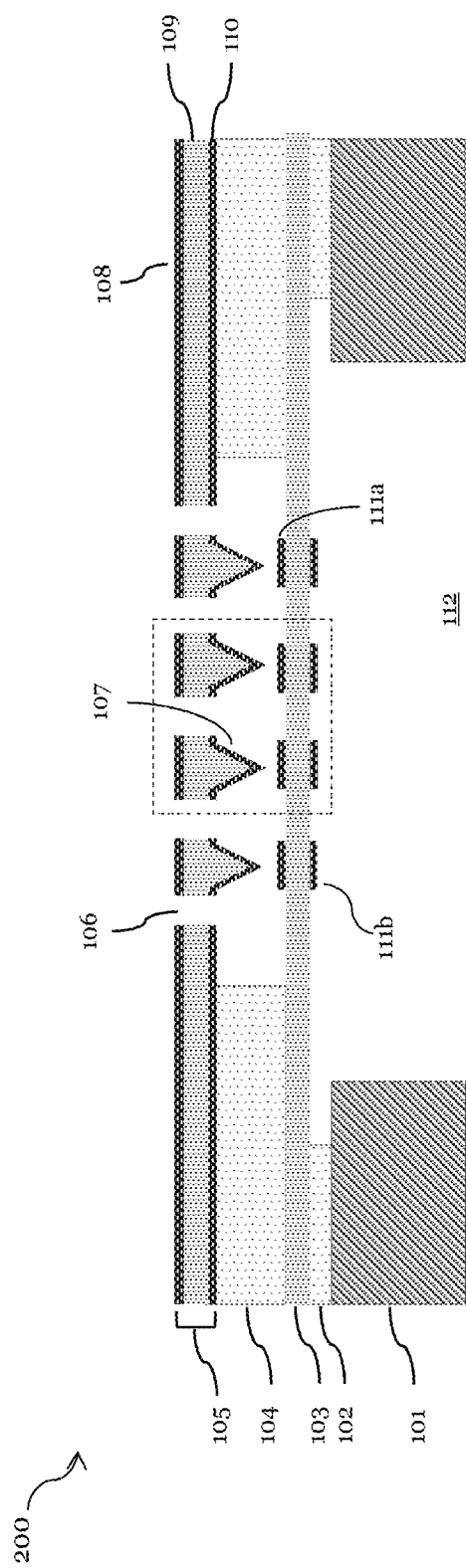
FIG. 3 illustrates a cross sectional view of an embodiment of a MEMS microphone in which additional material is deposited on top as well as disposed below a flexible membrane at the level of the bumps.

FIG. 3 illustrates a cross sectional view of an alternative embodiment of a MEMS device 200. In this particular embodiment of a MEMS microphone, material is not only deposited on top of the flexible membrane in the form of the first plurality of features 111a (as detailed above), but the same, or similar, insulating material is additionally disposed below the flexible membrane 103, in the form of a second plurality of features 111b.

The second plurality of features 111b disposed below the flexible membrane 103 provides additional reinforcement to the otherwise fragile flexible membrane 103. Moreover, the second plurality of features 111b balances the stress induced by the additional material on the flexible membrane 103.

Figure 4:
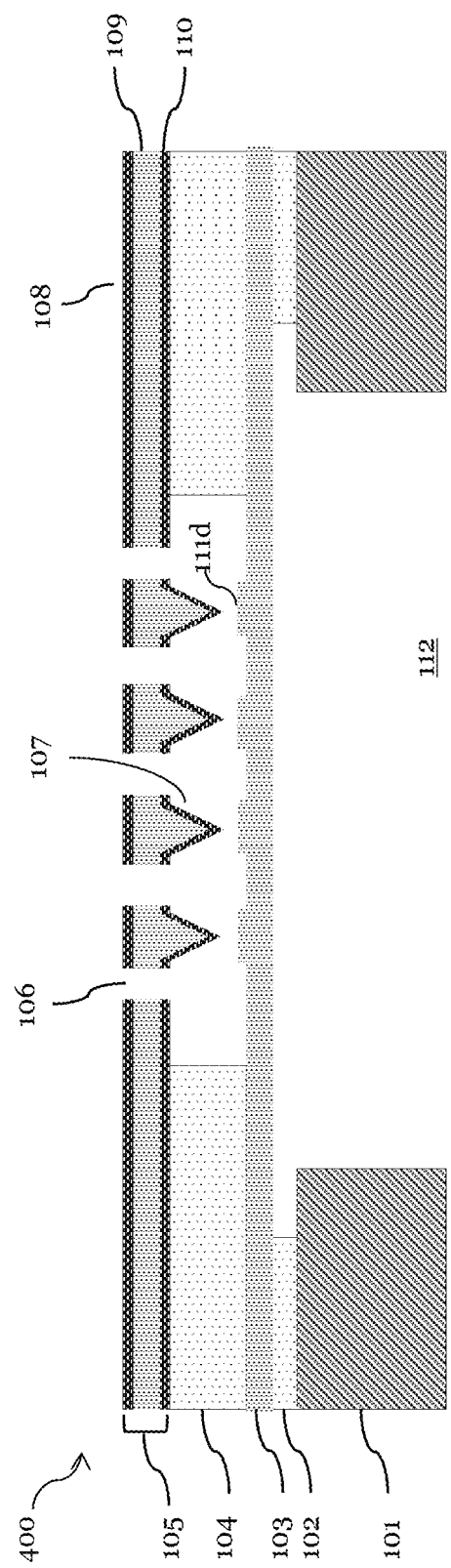
FIG. 4 illustrates a cross sectional view of an embodiment of a MEMS microphone in which additional material deposited on top of a flexible membrane is comprised of the same material.

FIG. 4 illustrates a cross sectional view of an embodiment of a MEMS device 400.

In this embodiment, a third plurality of features 111d is deposited on top of the flexible membrane 103 may be comprised of the same material as the flexible membrane 103. In other words, in this embodiment, portions of the flexible membrane 103 that are likely to be more susceptible to stress induced failure are made thicker.

Accordingly, the additional material added to the flexible membrane 103 can be thought of as a local thickening of the membrane material. The third plurality of features 111d can be fabricated using similar fabrication techniques adopted for the construction of the first plurality of features ma. Alternately, in some embodiments, the third plurality of features 111d may be formed along with the flexible membrane 103, where regions without the third plurality of features 111d are recessed.

Figure 5:
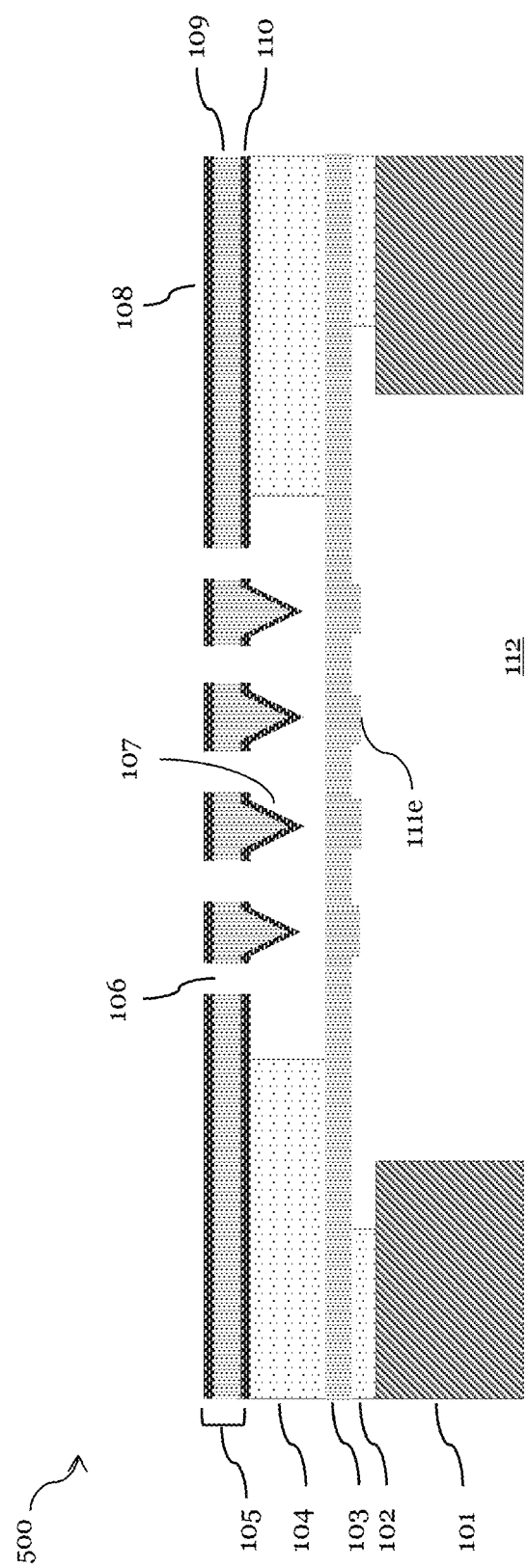
FIG. 5 illustrates a cross sectional view of an embodiment of a MEMS microphone in which additional material disposed below a flexible membrane is comprised of the same material.

FIG. 5 illustrates a cross sectional view of an embodiment of a MEMS device 500.

In this embodiment, additional material is disposed on the bottom of the flexible membrane 103 as fourth plurality of features me, which may also be comprised of the same material as the flexible membrane 103. Advantageously, this embodiment reinforces the flexible membrane 103 without any change in capacitance between the flexible membrane 103 and the first backplate 105.

As previously discussed, the fourth plurality of features me can be fabricated using similar fabrication techniques adopted for the construction of the first plurality of features ma. Alternatively, the fourth plurality of features me may be formed along with the flexible membrane 103, where regions without the fourth plurality of features me are recessed.

Figure 6A:
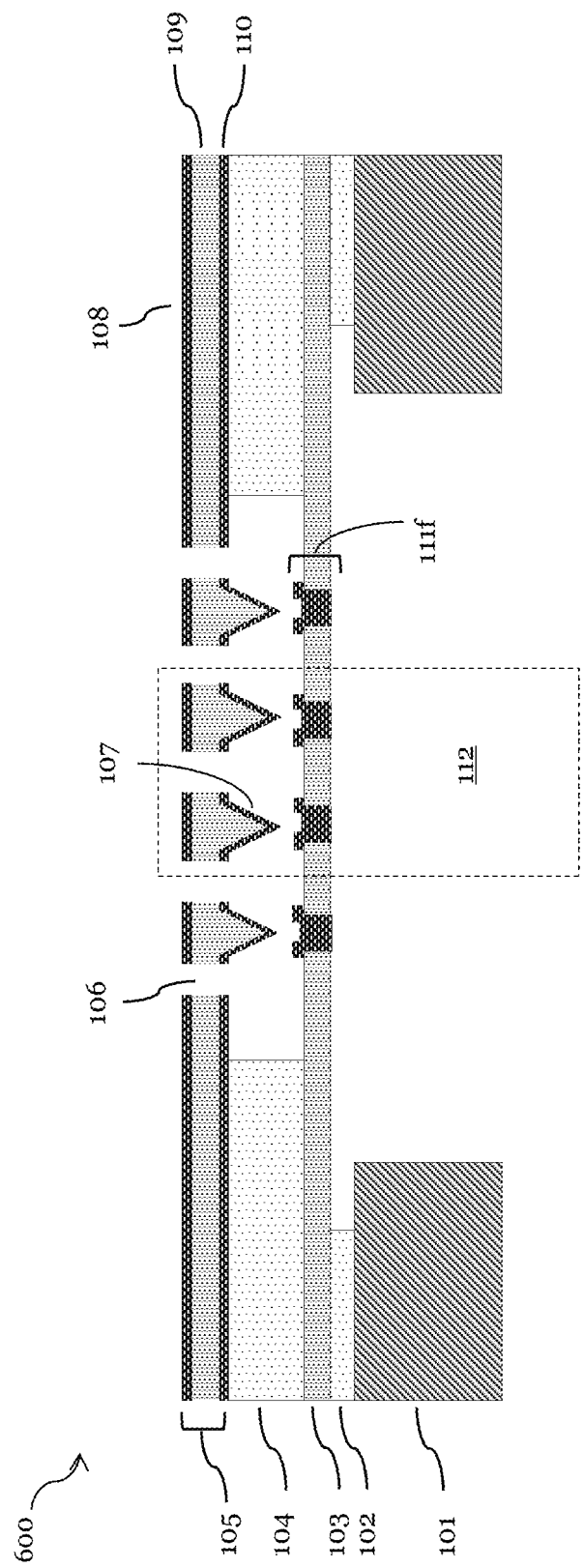
Figure 6B:
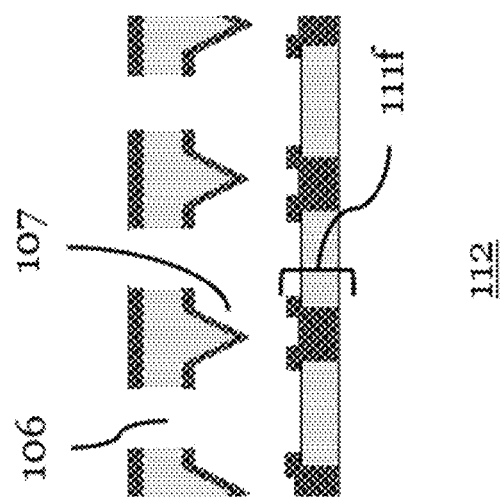
FIG. 6B represents a magnified portion of the dashed region illustrated by FIG. 6A.

FIG. 6A illustrates a cross sectional view of an embodiment of a MEMS device 600 while FIG. 6B represents a magnified portion of the dashed region illustrated by FIG. 6A. In this embodiment, sections of the flexible membrane 103, at the level of the first plurality of bumps 107, are replaced by an alternate reinforcement material, in the form of the fifth plurality of features 111f. The fifth plurality of features 111f may be composed of a different material than the flexible membrane 103. In various embodiments, the fifth plurality of features 111f comprises a material that is more immune to cracking than the flexible membrane 103, and in particular, may have a higher fracture toughness than the flexible membrane 103. The fifth plurality of features 111f may comprise materials that are more rigid than the flexible membrane 103. For example, the fifth plurality of features 111f may be composed of silicon nitride layers (SiN), silicon oxide layers (SiO2), silicon carbide layers (SiC), TiN, TaN, and others.

Each of the fifth plurality of features 111f comprises sidewalls that can be orthogonal or have a slope to a major outer surface of the flexible membrane 103. The fifth plurality of features 111f comprises a first portion filled within through holes in the flexible membrane 103. A second annular region extends over a portion of the top surface of the flexible membrane 103. The second annular region may comprise protrusions extending from the flexible membrane 103 in a direction towards the first plurality of bumps 107.

The fifth plurality of features 111f may be constructed through conventional microfabrication schemes, many of which have been mentioned herein in various embodiments.

Figure 7:
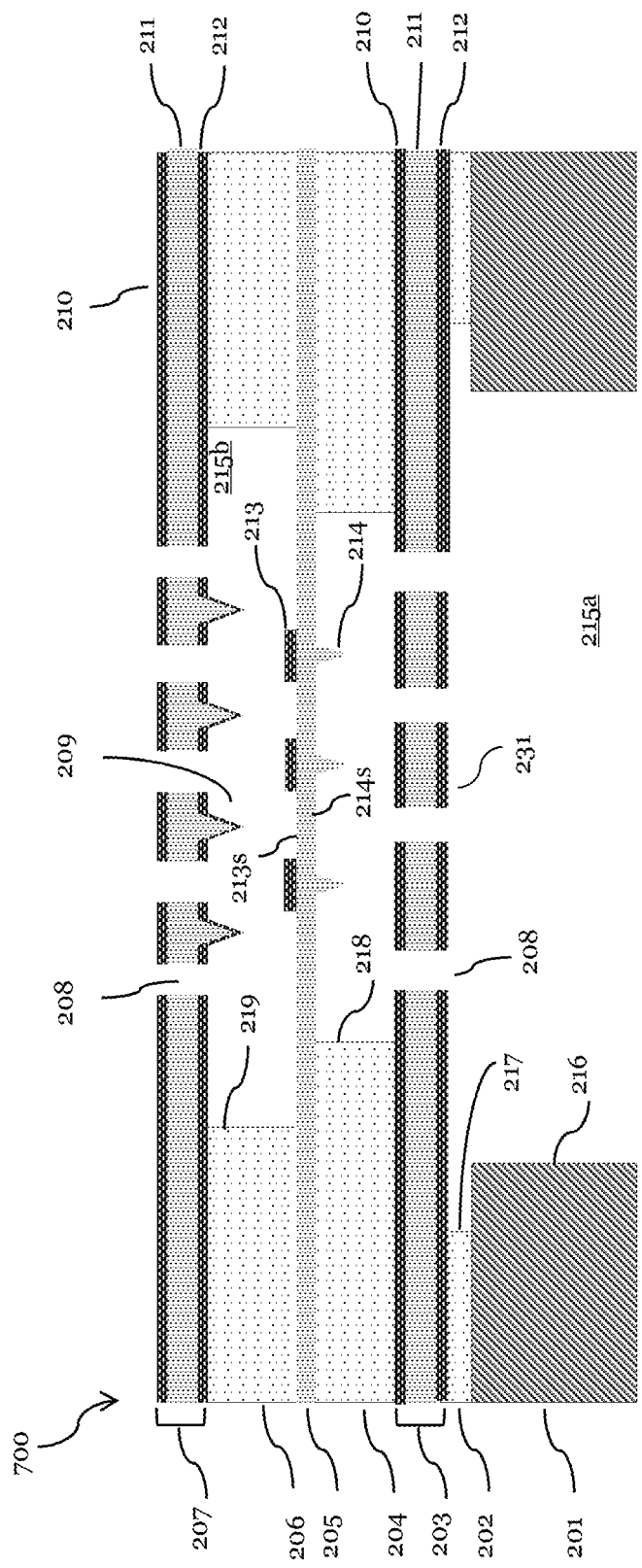
FIG. 7 illustrates a cross sectional view of an embodiment of a dual plated MEMS microphone in which the flexible membrane comprises additional material deposited above the flexible membrane, as well as anti-sticking bumps added below the flexible membrane, wherein the additional material is deposited on top of the anti-sticking bumps of the membrane.

FIG. 7 illustrates a cross sectional view of an embodiment of a MEMS device which is a dual backplate MEMS microphone.

The dual backplate MEMS microphone design provides a differential MEMS sensor. Accordingly, the dual backplate MEMS microphone outputs two symmetrical 180 degree phase shifted signals due to the motion of the flexible membrane.

Unlike the prior embodiments, because of the additional backplate, this embodiment includes a different design for the anti-sticking bumps and the protrusions. In one or more embodiments, the anti-sticking bumps and the protrusions on the flexible membrane 205 may be directly aligned in a vertical direction.

Similar to prior embodiments, the MEMS device 700 includes a substrate 201, a first, a second, and a third clamping layers 202, 204, and 206, a bottom backplate 203, a flexible membrane 205, and a top backplate 207. According to various embodiments, the flexible membrane 205 is positioned between the bottom backplate 203 and the top backplate 207. The first clamping layer 202 is disposed between the substrate 201 and the bottom backplate 203. The second clamping layer 204 is disposed between the bottom backplate 203 and the flexible membrane 205. The third clamping layer 206 is disposed between the flexible membrane 205 and the top backplate 207. According to an embodiment of the MEMS device 200, the flexible membrane 205 separates the bottom cavity 215a from the top cavity 215b.

Similar to prior embodiments, some of the clamping layers may be retracted further inwards than substrate edge 216 and/or other clamping layers within the device. For example, in one embodiment, the second clamping layer 204 extends further into the bottom cavity 215a than its other counterparts, namely the first clamping layer 202 and the third clamping layer 206. In various embodiments, extension of the first, the second, and the third clamping layers 202, 204, and 206, may be determined by the size and position of the perforations 208, fabricated within the bottom and the top backplates 203 and 207.

Details about the functionality and characteristics of the perforations 208 can be referenced above to the perforations 106 detailed in discussions about the single backplate MEMS device in FIG. 1A. In some embodiments, some clamping layers may be thicker than other clamping layers. For example, in one embodiment, the first clamping layer 202 may be much thinner than the second clamping layer 204 or the third clamping layer 206.

According to various embodiments, the substrate 201 may be comprised of silicon material or any other material that can be utilized to form a supportive substrate structure for the various layers within the MEMS device 200. A bottom cavity 215a is formed within the substrate 201 as described previously. The first, the second, and the third clamping layers 202, 204, and 206, which have been discussed in earlier mentions, are used as support structures for various layers within the MEMS device 200. More specifically, the first, the second, and the third clamping layers 202, 204, and 206 help lend support to the bottom and the top backplates 203 and 207, as well as the flexible membrane 205. The first, the second, and the third clamping layers 202, 204, and 206 may be comprised of insulating material such as tetraethyl orthosilicate (TEOS) oxide in some embodiments. Alternatively, the first, the second, and the third clamping layers 202, 204, and 206 may be formed of any other insulating material, such as another oxide or a dielectric.

The bottom backplate 203, which is positioned between the first clamping layer 202 and the second clamping layer 204 is a rigid structure comprised of the first and the second insulating layers 210 and 212, and a conductive layer 211. According to some embodiments, the bottom backplate 203 may also include perforations 208 of various sized diameters, ranging from small to large, with connecting members 231. As discussed earlier, the perforations 208 may serve as release holes for an etch fabrication step. In various embodiments, the perforations 208 may include numerous small diameter perforations arranged closely together and around the perimeter of a deflectable portion of the flexible membrane 205. The spacing and size of the perforations 208 may be used to control both the position and smoothness of any adjacent clamping layer edges.

The top backplate 207, which is disposed above the third clamping layer 206, may also be a rigid structure comprised of the first and the second insulating layers 210 and 212, and a conductive layer 211.

Similar to prior embodiments, the top backplate 207 may comprise a first plurality of anti-sticking bumps 209 that minimize sticking with the flexible membrane 205. The first plurality of anti-sticking bumps 209 is comprised of layers from the second insulating layer 212 and the conductive layer 211 of the top backplate 207. Therefore, in an embodiment, the first plurality of anti-sticking bumps 209 may be comprised of a layer of silicon nitride and a layer of doped polysilicon. In other embodiments, the first plurality of anti-sticking bumps 209 may be fabricated from any other combination of insulating or conductive materials known to the art. Much like the bottom backplate 203, the top backplate 207 may also contain perforations 208 of various diameters.

Although the first plurality of anti-sticking bumps 209 are shown aligned with the plurality of features 213, in various embodiments, they may be located in other regions of the top backplate 207. In contrast, in various embodiments, the second plurality of anti-sticking bumps 214 are aligned with connecting members 231 and not the perforations 208 on the bottom backplate 203.

Embodiments of the MEMS device 700 include a flexible membrane 205 positioned between the bottom backplate 203 and the top backplate 207; more specifically, between the second and the third clamping layers 204 and 206. The flexible membrane 205 comprises a first major surface 214s and an opposite second major surface 213s.

A second plurality of anti-sticking bumps 214 is disposed at the first major surface 214s. The second plurality of anti-sticking bumps 214 mitigate the sticking of the flexible membrane 205 with the bottom backplate 203. The inventors of this application have identified that a portion of the second major surface 213s that overlays the second plurality of anti-sticking bumps 214 are the points with high stress intensity after a particle impact. Therefore, a sixth plurality of features 213 is disposed on the flexible membrane 205 so as to vertically overlap with the second plurality of anti-sticking bumps 214.

As in prior embodiments, the sixth plurality of features 213 comprise protrusions extending from the second major surface 213s of the flexible membrane 205 in a direction towards the first plurality of anti-sticking bumps 209. Each of the sixth plurality of features 213 is associated with a corresponding one of the second plurality of anti-sticking bumps 214. However, since the sixth plurality of features 213 vertically overlap with the second plurality of anti-sticking bumps 214, they may not be overlap with the first plurality of anti-sticking bumps 209 but are rather staggered relative to the first plurality of anti-sticking bumps 209.

Similar to prior embodiments, each of the sixth plurality of features 213 may comprise sidewalls orthogonal to a major outer surface of the flexible membrane 205 (as previously discussed, e.g., in FIG. 2B). While in other embodiments, each of the sixth plurality of features 213 may comprise angled sidewalls (as depicted in FIG. 2C) to alleviate the buildup of stress concentrated at the major outer surface of the flexible membrane 205.

According to some embodiments, the sixth plurality of features 213 may be composed of a different material than that of the flexible membrane 205. As in prior embodiments, the sixth plurality of features 213 may be composed of silicon nitride layers (SiN), silicon oxide layers (SiO2), silicon carbide layers (SiC), or other insulating material.

In various embodiments, the sixth plurality of features 213 may be constructed through conventional microfabrication processes. For example, an insulating material, like those mentioned above, can be deposited on the top surface of the flexible membrane 205. Through various photolithographic and etching steps, coupled along with additional microfabrication processing schemes known to the art, such as cleaning and planarization, the formation of the sixth plurality of features 213 is revealed. As noted earlier, the edges of the sixth plurality of features 213 can be etched in a manner that achieves a vertical sidewall profile (as illustrated in FIG. 2B). In other embodiments, the edges of the sixth plurality of features 213 can be etched in a manner that achieves more of an angled sidewall profile (as illustrated in FIG. 2C). The sixth plurality of features 213 may range in size from 10 nm to 1 μm in thickness and may have a lateral dimension around 500 nm to 5 μm larger than that of the contact area of the first plurality of anti-sticking bumps 209.

The second plurality of anti-sticking bumps 214 can be fabricated using similar fabrication techniques detailed herein; and furthermore may comprise the same material utilized for the flexible membrane 205.

Advantages of various embodiments described herein may include devices exhibiting improved robustness for shock and loud sound pressure waves. Furthermore, improvements may be seen in regards to the membrane which becomes particularly sensitive when a particle hits at the vicinity of an anti-stinking bump, causing highly destructive stress during deflection of the flexible membrane. The various embodiments described herein avoid destructive damage to the layers of the MEMS microphone, by reinforcing the flexible membrane so it is more robust, particularly in areas near the vicinity of any anti-sticking bumps.

Example embodiments of the invention are summarized here. Other embodiments can also be understood from the entirety of the specification as well as the claims filed herein.

Example 1

A micro electrical mechanical systems (MEMS) device includes a flexible membrane disposed over a substrate; a first backplate disposed over the flexible membrane, where the first backplate includes a first plurality of bumps facing the flexible membrane; and a plurality of features disposed at the flexible membrane, where each of the plurality of features being associated with a corresponding one of the first plurality of bumps.

Example 2

The MEMS device of example 1, where the plurality of features is aligned with a corresponding one of the first plurality of bumps.

Example 3

The MEMS device of one of examples 1 or 2, where the plurality of features includes locally thicker regions of the flexible membrane.

Example 4

The MEMS device of one of examples 1 to 3, where the plurality of features include protrusions extending from the flexible membrane in a direction towards the first plurality of bumps.

Example 5

The MEMS device of one of examples 1 to 4, where the plurality of features include protrusions extending from the flexible membrane in a direction away from the first plurality of bumps.

Example 6

The MEMS device of one of examples 1, 2, 4, 5, where the plurality of features include a different material than the flexible membrane.

Example 7

The MEMS device of one of examples 1 to 6, where the plurality of features is disposed over the flexible membrane and disposed between the flexible membrane and the first plurality of bumps.

Example 8

The MEMS device of one of examples 1 to 7, where the plurality of features include: a first set of regions that is disposed over the flexible membrane, and located between the flexible membrane and the first plurality of bumps; and a second set of regions that is disposed under the flexible membrane, and where the flexible membrane is disposed between the second set of regions and the first plurality of bumps.

Example 9

The MEMS device of one of examples 1, 2, 4, 6, 7, where the plurality of features is disposed within the flexible membrane.

Example 10

The MEMS device of one of examples 1 to 9, further including: a second backplate disposed between the flexible membrane and the substrate; and a second plurality of bumps disposed on the flexible membrane, where the plurality of features is aligned with a corresponding one of the second plurality of bumps.

Example 11

The MEMS device of one of examples 1 to 10, where each of the first plurality of features include sidewalls inclined to a major outer surface of the flexible membrane.

Example 12

The MEMS device of one of examples 1 to 11, where each of the first plurality of features include sidewalls orthogonal to a major outer surface of the flexible membrane.

Example 13

A micro electrical mechanical systems (MEMS) device includes a deflectable layer disposed over a substrate; a first backplate disposed over the deflectable layer, the first backplate including a first plurality of anti-sticking structures facing the deflectable layer; and a plurality of reinforcement regions disposed at the deflectable layer, the plurality of reinforcement regions configured to reinforce the deflectable layer from stress induced failure, the plurality of reinforcement regions being associated with a corresponding one of the first plurality of anti-sticking structures.

Example 14

The MEMS device of example 13, where the plurality of reinforcement regions includes regions of the deflectable layer that are locally thicker.

Example 15

The MEMS device of example 13, where the plurality of reinforcement regions includes a different material than the deflectable layer.

Example 16

The MEMS device of one of examples 13 to 15, where the plurality of reinforcement regions is disposed within the deflectable layer.

Example 17

A micro electrical mechanical systems (MEMS) device includes a first backplate including a first plurality of anti-sticking bumps; a flexible membrane including a first major surface and an opposite second major surface, a second plurality of anti-sticking bumps at the first major surface and a plurality of features at the second major surface, each of the plurality of features being associated with a corresponding one of the second plurality of anti-sticking bumps; and a second backplate, the flexible membrane being disposed between the first and the second backplates.

Example 18

The MEMS device of example 17, where one of the first plurality of anti-sticking bumps is disposed between adjacent ones of the plurality of features.

Example 19

The MEMS device of one of examples 17 or 18, where the second backplate includes a plurality of openings and connecting members, where the second plurality of anti-sticking bumps are aligned with the connecting members in a direction orthogonal to a major surface of the second backplate.

Example 20

The MEMS device of one of examples 17 to 19, where each of the plurality of features is aligned with a corresponding one of the second plurality of anti-sticking bumps in a direction orthogonal to a major surface of the second backplate.

Although embodiments of the present application have been described in a specific context using namely MEMS microphones, various embodiments include other MEMS devices and structure that includes MEMS capacitive acoustic transducer systems, MEMS microphone systems, silicon microphone systems, single and double backplate microphone systems, and mechanical support MEMS microphone systems.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A micro electrical mechanical systems (MEMS) device comprising:
   a flexible membrane disposed over a substrate;
   a first backplate disposed over the flexible membrane, the first backplate comprising a first plurality of bumps facing the flexible membrane; and
   a plurality of features disposed at the flexible membrane, each of the plurality of features being associated with a corresponding one of the first plurality of bumps, wherein the plurality of features comprise a different material than the flexible membrane.

2. The MEMS device of claim 1, wherein the plurality of features is aligned with a corresponding one of the first plurality of bumps.

3. The MEMS device of claim 1, wherein the plurality of features comprise protrusions extending from the flexible membrane in a direction towards the first plurality of bumps.

4. The MEMS device of claim 1, wherein the plurality of features comprise protrusions extending from the flexible membrane in a direction away from the first plurality of bumps.

5. The MEMS device of claim 1, wherein the plurality of features is disposed over the flexible membrane and disposed between the flexible membrane and the first plurality of bumps.

6. The MEMS device of claim 1, wherein the plurality of features comprise:
   a first set of regions that is disposed over the flexible membrane, and located between the flexible membrane and the first plurality of bumps; and
   a second set of regions that is disposed under the flexible membrane, and wherein the flexible membrane is disposed between the second set of regions and the first plurality of bumps.

7. The MEMS device of claim 1, wherein the plurality of features is disposed within the flexible membrane.

8. The MEMS device of claim 1, further comprising:
   a second backplate disposed between the flexible membrane and the substrate; and
   a second plurality of bumps disposed on the flexible membrane, wherein the plurality of features is aligned with a corresponding one of the second plurality of bumps.

9. The MEMS device of claim 1, wherein each of the plurality of features comprise sidewalls inclined to a major outer surface of the flexible membrane.

10. The MEMS device of claim 1, wherein each of the plurality of features comprise sidewalls orthogonal to a major outer surface of the flexible membrane.

11. A micro electrical mechanical systems (MEMS) device comprising:
    a deflectable layer disposed over a substrate;
    a first backplate disposed over the deflectable layer, the first backplate comprising a first plurality of anti-sticking structures facing the deflectable layer; and
    a plurality of reinforcement regions disposed at the deflectable layer, the plurality of reinforcement regions configured to reinforce the deflectable layer from stress induced failure, the plurality of reinforcement regions being associated with a corresponding one of the first plurality of anti-sticking structures, wherein the plurality of reinforcement regions comprises a different material than the deflectable layer.

12. The MEMS device of claim 11, wherein the plurality of reinforcement regions is disposed within the deflectable layer.

13. A micro electrical mechanical systems (MEMS) device comprising:
    a first backplate comprising a first plurality of anti-sticking bumps;
    a flexible membrane comprising a first major surface and an opposite second major surface, a second plurality of anti-sticking bumps at the first major surface and a plurality of features at the second major surface, each of the plurality of features being associated with a corresponding one of the second plurality of anti-sticking bumps, wherein one of the first plurality of anti-sticking bumps is disposed between adjacent ones of the plurality of features; and
    a second backplate, the flexible membrane being disposed between the first and the second backplates.

14. The MEMS device of claim 13, wherein the second backplate comprises a plurality of openings and connecting members, wherein the second plurality of anti-sticking bumps are aligned with the connecting members in a direction orthogonal to a major surface of the second backplate.

15. The MEMS device of claim 13, wherein each of the plurality of features is aligned with a corresponding one of the second plurality of anti-sticking bumps in a direction orthogonal to a major surface of the second backplate.

16. The MEMS device of claim 11, wherein the plurality of reinforcement regions comprises a first portion filled within through holes in the deflectable layer and a second portion extends over a portion of a top surface of the deflectable layer.

17. The MEMS device of claim 16, wherein the second portion comprises an annular region comprising protrusions extending from the deflectable layer in a direction towards the first plurality of anti-sticking structures.

18. The MEMS device of claim 11, further comprising:
    a second backplate disposed between the deflectable layer and the substrate; and
    a second plurality of anti-sticking structures disposed on the deflectable layer, wherein the plurality of reinforcement regions is aligned with a corresponding one of the second plurality of anti-sticking structures.

19. The MEMS device of claim 11, wherein each of the plurality of reinforcement regions comprise sidewalls inclined to a major outer surface of the deflectable layer.

20. The MEMS device of claim 11, wherein each of the plurality of reinforcement regions comprise sidewalls orthogonal to a major outer surface of the deflectable layer.

* * * * *